US007888601B2

(12) United States Patent
Bax et al.

(10) Patent No.: US 7,888,601 B2
(45) Date of Patent: Feb. 15, 2011

(54) BUS BAR INTERCONNECTION TECHNIQUES

(75) Inventors: Randall L. Bax, Andover, MN (US); Karim Elayed, Plymouth, MN (US); Paul Medina, W. St. Paul, MN (US)

(73) Assignee: Cummins Power Generations IP, Inc., Minneapolis, MN (US)

( * ) Notice: Subject to any disclaimer, the term of this patent is extended or adjusted under 35 U.S.C. 154(b) by 924 days.

(21) Appl. No.: 11/809,607

(22) Filed: Jun. 1, 2007

(65) Prior Publication Data

US 2008/0160840 A1 Jul. 3, 2008

Related U.S. Application Data

(60) Provisional application No. 60/877,971, filed on Dec. 29, 2006.

(51) Int. Cl.

| | |
|---|---|
| ***H05K 1/00*** | (2006.01) |
| ***H05K 1/11*** | (2006.01) |
| ***H05K 7/20*** | (2006.01) |
| ***H01R 12/04*** | (2006.01) |

(52) U.S. Cl. ........................ 174/252; 174/261; 361/709

(58) Field of Classification Search ................. 174/252, 174/261; 361/702, 709

See application file for complete search history.

(56) References Cited

U.S. PATENT DOCUMENTS

| | | | |
|---|---|---|---|
| 4,063,162 | A | 12/1977 | Lanz et al. |
| 4,208,693 | A | 6/1980 | Dickens et al. |
| 4,245,182 | A | 1/1981 | Aotsu et al. |
| 4,262,212 | A | 4/1981 | Jacob et al. |
| 4,443,828 | A | 4/1984 | Legrand et al. |
| 4,589,052 | A | 5/1986 | Dougherty |
| 4,661,769 | A | 4/1987 | Girgis |
| 4,835,405 | A | 5/1989 | Clancey et al. |
| 4,855,664 | A | 8/1989 | Lane |
| 4,912,382 | A | 3/1990 | Koenig et al. |
| 4,996,646 | A | 2/1991 | Farrington |
| 5,006,781 | A | 4/1991 | Schultz et al. |
| 5,029,120 | A | 7/1991 | Brodeur et al. |
| 5,117,174 | A | 5/1992 | Kessler |
| 5,168,208 | A | 12/1992 | Schultz et al. |
| 5,305,185 | A | 4/1994 | Samarov et al. |
| 5,315,229 | A | 5/1994 | Markus |
| 5,390,068 | A | 2/1995 | Schultz et al. |
| 5,406,495 | A | 4/1995 | Hill |
| 5,433,175 | A | 7/1995 | Hughes et al. |

(Continued)

*Primary Examiner*—Jeremy C Norris
(74) *Attorney, Agent, or Firm*—Krieg DeVault LLP; J. Bruce Schelkopf; L. Scott Paynter

(57) ABSTRACT

One system of the present application includes an electronic assembly with a heat dissipating device, printed wiring board with electronic circuitry, bus bar, insulative grommet, and fastener. The board defines a bus with an interconnection pad and a board opening. The bus bar connects with the interconnection pad and defines a bar opening with a beveled shoulder portion that align with the board opening to define a passage to a fastening site of the heat dissipating device. The grommet defines a distal end portion opposite a proximal end portion shaped with a flange. The distal end portion is inserted into the passage with the flange abutting the beveled shoulder portion. The fastener extends through the grommet to provide a mechanical connection of the board and bar to the site and maintain thermal coupling between the board and device while the grommet electrically insulates the fastener from the bar.

18 Claims, 4 Drawing Sheets

U.S. PATENT DOCUMENTS

| | | | | |
|---|---|---|---|---|
| 5,587,917 | A | 12/1996 | Elms | |
| 5,592,021 | A | 1/1997 | Meschter et al. | |
| 5,592,393 | A | 1/1997 | Yalla | |
| 5,701,070 | A | 12/1997 | Schultz | |
| 5,784,267 | A | 7/1998 | Koenig et al. | |
| 5,890,097 | A | 3/1999 | Cox | |
| 5,901,039 | A * | 5/1999 | Dehaine et al. | 361/704 |
| 5,909,656 | A | 6/1999 | Yang | |
| 6,037,768 | A | 3/2000 | Moulder et al. | |
| 6,038,267 | A | 3/2000 | Oura et al. | |
| 6,084,776 | A * | 7/2000 | Cuntz et al. | 361/707 |
| 6,088,226 | A | 7/2000 | Rearick | |
| 6,144,092 | A | 11/2000 | Kappes et al. | |
| 6,173,216 | B1 | 1/2001 | Vu et al. | |
| 6,392,371 | B1 | 5/2002 | Cheng et al. | |
| 6,483,708 | B2 | 11/2002 | Ali et al. | |
| 6,545,870 | B1 | 4/2003 | Franke et al. | |
| 6,549,410 | B1 | 4/2003 | Cohen | |
| 6,654,250 | B1 | 11/2003 | Alcoe | |
| 6,765,157 | B2 | 7/2004 | Rademacher et al. | |
| 6,782,941 | B2 | 8/2004 | Lee | |
| 6,801,019 | B2 | 10/2004 | Haydock et al. | |
| 6,965,818 | B2 | 11/2005 | Koenig et al. | |
| 6,972,972 | B2 | 12/2005 | Duncan et al. | |
| 6,984,897 | B2 | 1/2006 | Skeist et al. | |
| 6,994,360 | B2 | 2/2006 | Kuang et al. | |
| 7,315,449 | B2 * | 1/2008 | Lewis | 361/702 |
| 2002/0044422 | A1 | 4/2002 | Bailey et al. | |
| 2004/0057212 | A1 | 3/2004 | Russell et al. | |

* cited by examiner

BUS BAR INTERCONNECTION TECHNIQUES

CROSS-REFERENCE TO RELATED APPLICATIONS

The present application claims the benefit of U.S. Provisional Patent Application No. 60/877,971 filed on Dec. 29, 2006, which is incorporated herein by reference.

BACKGROUND

The present invention relates to electrical systems, and more particularly, but not exclusively, relates to power electronics assembly.

High electric current levels and concomitant heat dissipation requirements of power electronics devices often present several challenges in terms of device packaging and assembly. These challenges can be exacerbated by the frequent desire to utilize as little space as possible in order to miniaturize the overall size of the assembly. Thus, there is an ongoing demand for further contributions in this area of technology.

SUMMARY

One embodiment of the present invention includes a unique technique involving electric power device assembly. Other embodiments include unique methods, systems, devices, and apparatus involving electric power device assembly. Further embodiments, forms, features, aspects, benefits, and advantages of the present application shall become apparent from the description and figures provided herewith.

DETAILED DESCRIPTION OF REPRESENTATIVE EMBODIMENTS

Figure 1:
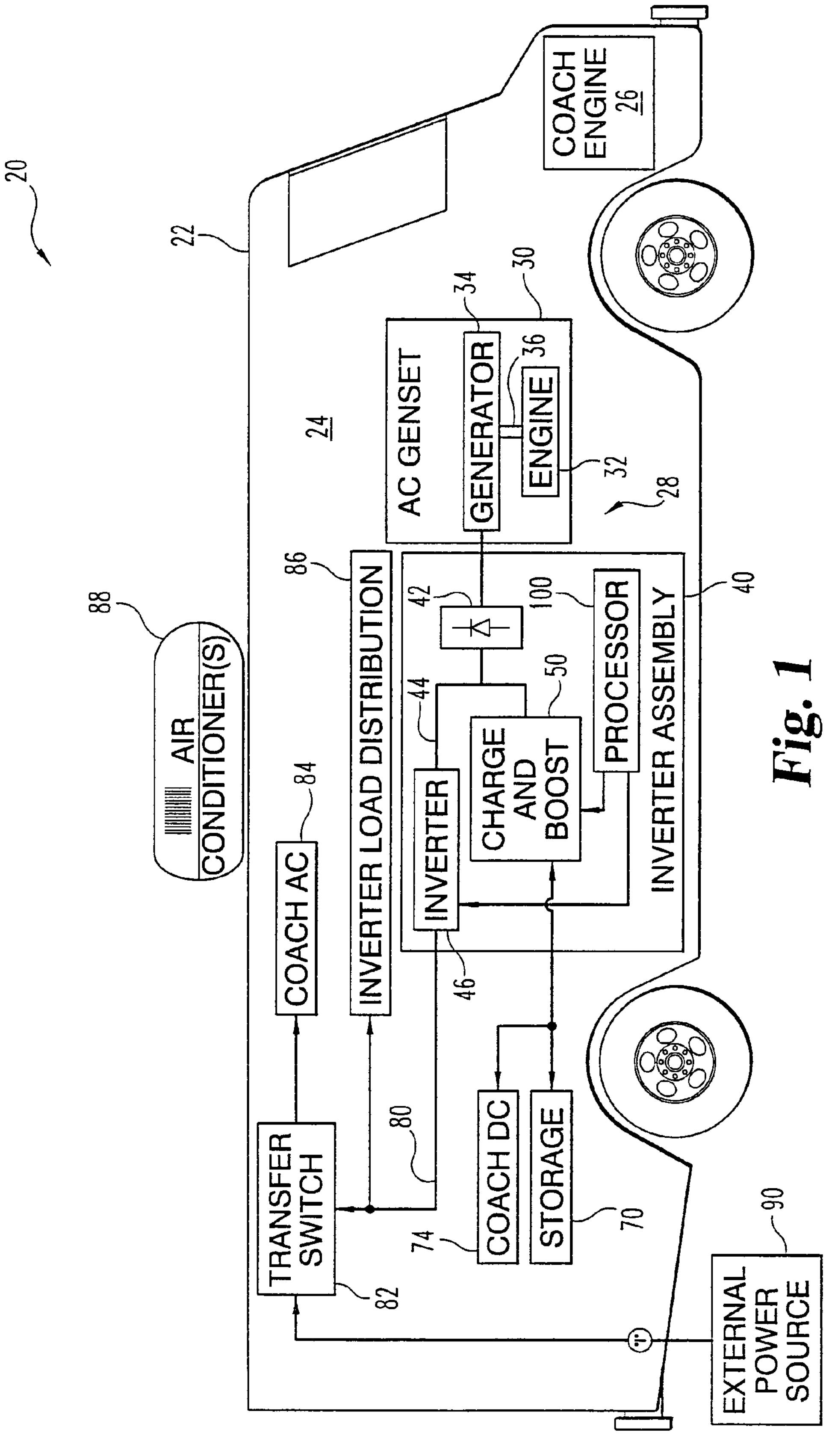
FIG. 1 is a diagrammatic view of a vehicle carrying an electric power generation system.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 illustrates vehicle 20 in the form of a motor coach 22. Motor coach 22 includes interior living space 24 and is propelled by coach engine 26. Coach engine 26 is typically of a reciprocating piston, internal combustion type. To complement living space 24, coach 26 carries various types of electrical equipment 27, such as one or more air conditioner(s) 88. Equipment 27 may further include lighting, kitchen appliances, entertainment devices, and/or such different devices as would occur to those skilled in the art. Coach 22 carries mobile electric power generation system 28 to selectively provide electricity to equipment 27. Correspondingly, equipment 27 electrically loads system 28. In one form, various components of system 28 are distributed throughout vehicle 20—being installed in various bays and/or other dedicated spaces.

System 28 includes two primary sources of power: Alternating Current (AC) power from genset 30 and Direct Current (DC) power from electrical energy storage device 70. Genset 30 includes a dedicated engine 32 and three-phase AC generator 34. Engine 32 provides rotational mechanical power to generator 34 with rotary drive member 36. In one arrangement, engine 32 is of a reciprocating piston type that directly drives generator 34, and generator 34 is of a permanent magnet alternator (PMA) type mounted to member 36, with member 36 being in the form of a drive shaft of engine 32. In other forms, generator 34 can be mechanically coupled to engine 32 by a mechanical linkage that provides a desired turn ratio, a torque converter, a transmission, and/or a different form of rotary linking mechanism as would occur to those skilled in the art. Operation of engine 32 is regulated via an Engine Control Module (ECM) (not shown) that is in turn responsive to control signals from control and inverter assembly 40 of system 28.

The rotational operating speed of engine 32, and correspondingly rotational speed of generator 34 varies over a selected operating range in response to changes in electrical loading of system 28. Over this range, genset rotational speed increases to meet larger power demands concomitant with an increasing electrical load on system 28. Genset 30 has a steady state minimum speed at the lower extreme of this speed range corresponding to low power output and a steady state maximum speed at the upper extreme of this speed range corresponding to high power output. As the speed of genset 30 varies, its three-phase electrical output varies in terms of AC frequency and voltage.

Genset 30 is electrically coupled to control and inverter assembly 40. Assembly 40 includes power control circuitry 40*a* to manage the electrical power generated and stored with system 28. Circuitry 40*a* includes three-phase rectifier 42, variable voltage DC power bus 44, DC-to-AC power inverter 46, charge and boost circuitry 50, and processor 100. Assembly 40 is coupled to storage device 70 to selectively charge it in certain operating modes and supply electrical energy from it in other operating modes via circuitry 50 as further described hereinafter. Assembly 40 provides DC electric power to the storage device one or more motor coach DC loads 74 with circuitry 50 and provides regulated AC electric power with inverter 46. AC electric loads are supplied via inverter AC output bus 80. Bus 80 is coupled to AC power transfer switch 82 of system 28. One or more coach AC electrical loads 84 are supplied via switch 82. System 28 also provides inverter load distribution 86 from bus 80 without switch 82 intervening therebetween.

As shown in FIG. 1, switch 82 is electrically coupled to external AC electrical power source 90 (shore power). It should be appreciated that shore power generally cannot be used when vehicle 20 is in motion, may not be available in some locations; and even if available, shore power is typically limited by a circuit breaker or fuse. When power from source 90 is applied, genset 30 is usually not active. Transfer switch 82 routes the shore power to service loads 84, and those supplied by inverter load distribution 86. With the supply of external AC power from source 90, assembly 40 selectively functions as one of loads 84, converting the AC shore power to a form suitable to charge storage device 70. In the following description, AC shore power should be understood to be absent unless expressly indicated to the contrary.

Assembly 40 further includes processor 100. Processor 100 executes operating logic that defines various control, management, and/or regulation functions. This operating logic may be in the form of dedicated hardware, such as a hardwired state machine, programming instructions, and/or a different form as would occur to those skilled in the art. Processor 100 may be provided as a single component, or a collection of operatively coupled components; and may be comprised of digital circuitry, analog circuitry, or a hybrid combination of both of these types. When of a multi-component form, processor 100 may have one or more components remotely located relative to the others. Processor 100 can include multiple processing units arranged to operate independently, in a pipeline processing arrangement, in a parallel processing arrangement, and/or such different arrangement as would occur to those skilled in the art. In one embodiment, processor 100 is a programmable microprocessing device of a solid-state, integrated circuit type that includes one or more processing units and memory. Processor 100 can include one or more signal conditioners, modulators, demodulators, Arithmetic Logic Units (ALUs), Central Processing Units (CPUs), limiters, oscillators, control clocks, amplifiers, signal conditioners, filters, format converters, communication ports, clamps, delay devices, memory devices, and/or different circuitry or functional components as would occur to those skilled in the art to perform the desired communications. In one form, processor 100 includes a computer network interface to facilitate communications the using the industry standard Controller Area Network (CAN) communications among various system components and/or components not included in the depicted system, as desired.

Figure 2:
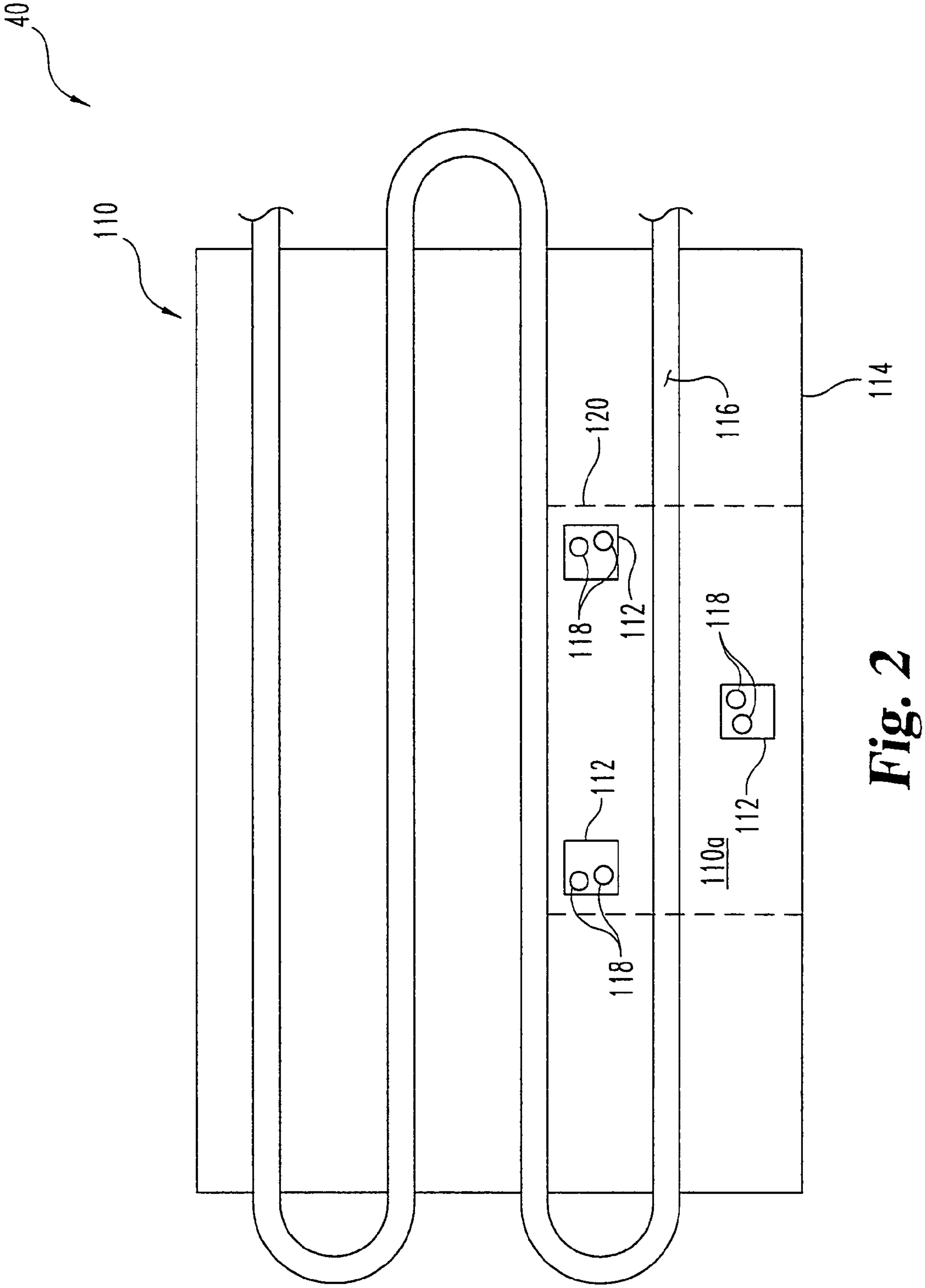
FIG. 2 is a top view of a heat dissipation device of a control and inverter assembly of FIG. 1, with the outline of a printed wiring board shown in phantom.

FIGS. 2-6 further illustrate selected aspects of a power electronics circuit device 105 included in assembly 40. Device 105 includes a printed wiring board 120, defining circuitry 126 with electrical bus bars 130 and connectors 148 (see FIG. 6). When fully assembled, device 105 is connected to a heat dissipating device 110 of assembly 40. In FIG. 2, device 110 is more specifically illustrated in the form of a cold plate 114. Plate 114 defines fastening sites 112 and includes a passage 116 through which cooling fluid can be directed. In one form, plate 114 is made of a heat dissipating material such as an aluminum alloy and passage 116 is generally made of copper alloy tubing to facilitate heat transfer.

FIG. 2 shows printed wiring board 120 in phantom (dashed lines) where it is intended to overlay and make contact with device 110 after assembly. Device 110 defines interface surface 110*a*. Surface 110*a* is disposed to be thermally coupled to board 120 by direct thermal contact and/or through intervening thermally conductive material, such as thermal grease, adhesive film, or the like. Sites 112 of plate 114 include threaded cavities 118. Threading defined by each of the cavities 118 is engaged by a connector 148 to provide a mechanical connection of board 120 and bars 130 to device 110 and maintain thermal coupling between board 120 and device 110, while at the same time providing for electrical isolation between certain components.

Figure 3:
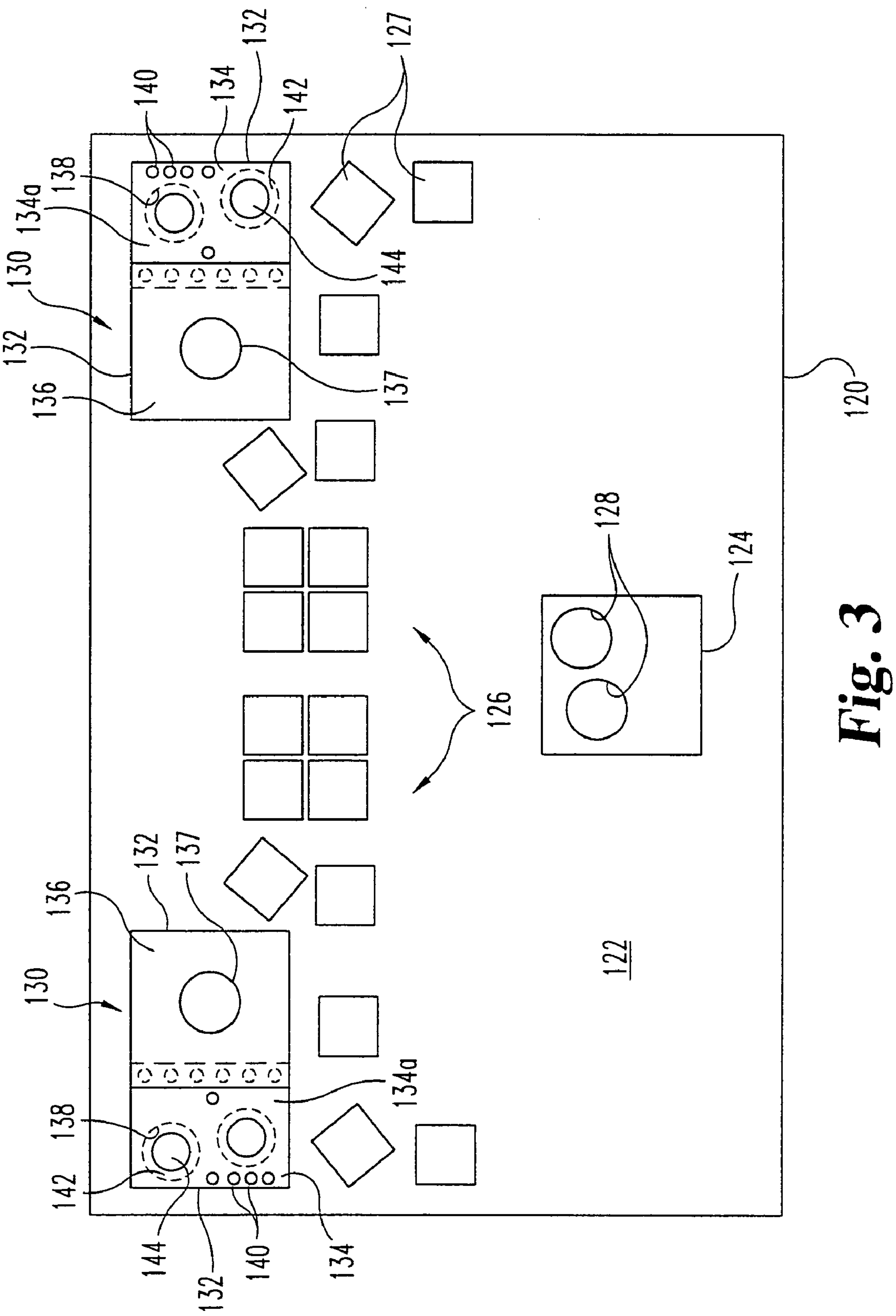
FIG. 3 is a top view of a partially assembled power electronics device that includes the printed wiring board represented in FIG. 2.

FIG. 3 illustrates device 105 in a partially assembled state. Board 120 defines three electrically conductive interconnection pads 124 and includes electronic circuitry 126. Bars 130 are coupled to pads 124, hiding two pads 124 from view; however, one pad 124 is not concealed by one of bars 130 in the partially assembled state depicted in FIG. 3. Board 120 defines openings 128 through at least a portion of pads 124. When board 120 is positioned on device 110 for assembly therewith, openings 128 are aligned with cavities 118. When fully assembled, circuitry 126 is electrically coupled with bus bars 130 and includes heat-generating electrical components, such as high-power semiconductor components like transistors and diodes, high-power passive components like resistors, high-current carrying connectors, and the like—just to name a few representative examples.

Figure 4:
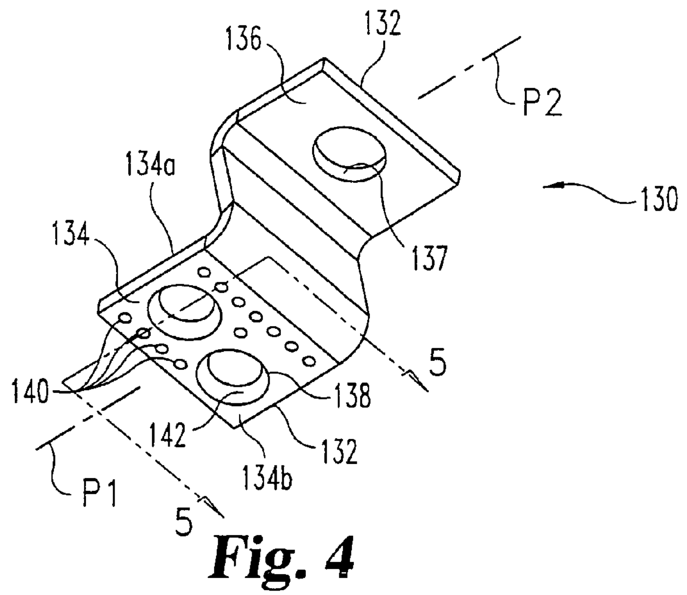
FIG. 4 is a perspective view of an electrical bus bar for assembly with the printed wiring board of FIGS. 2 and 3.

FIGS. 3 and 4 illustrate bars 130 as having a generally “S” or “Z” shape or configuration; however, other shapes and configurations can be used in different embodiments. Bars 130 allow for additional circuitry (not shown) and/or assemblies (not shown) to be electrically and/or mechanically connected to board 120. Bars 130 are electrically conductive and provide a high current connection to board 120. In one embodiment, bars 130 are metallic. Bars 130 also provide spatial clearance for high-current carrying devices of opposite polarity that is sufficient to meet attendant operational and safety margins. Bars 130 include a plurality of contact portions 132 in the form of a contact foot 134 and an elevated connection site 136. Site 136 includes a threaded hole 137 to facilitate connection to an electrically conductive cable, wire, another board, or the like with a threaded fastener. Sites 136 are displaced from contact foot 134 by a predetermined distance. In one embodiment, site 136 is positioned above contact foot 134 in approximately parallel alignment therewith. Correspondingly, opposing portions 132 of each bar 130 extend along generally parallel planes P1 and P2. Planes P1 and P2 are designated by coincident like-labeled axes in FIG. 4.

Figure 5:
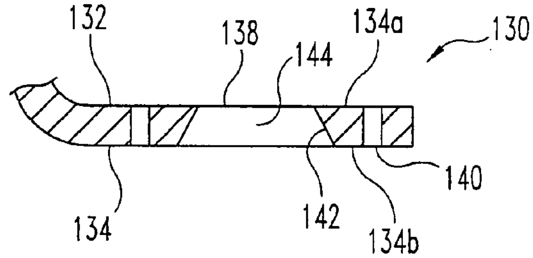
FIG. 5 is sectional view of a part of the contact foot of the electrical bus bar of FIG. 4 that corresponds to the 5-5 section line shown in FIG. 4.
Figure 6:
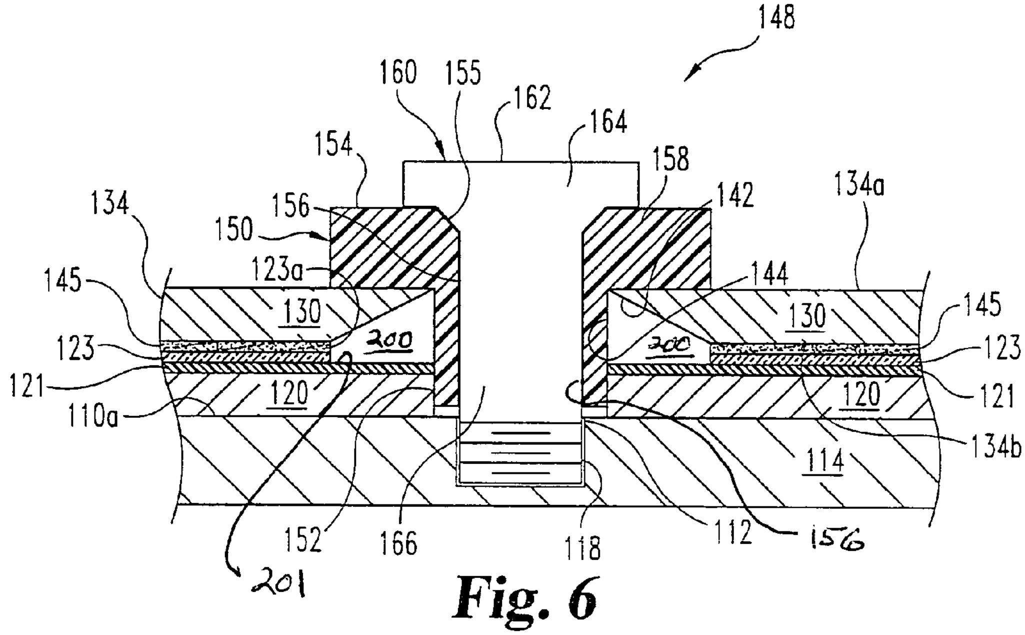
FIG. 6 is a side sectional view of the bus bar connection used in the assembly of the power electronics device of FIG. 3 to the heat dissipation device of FIG. 2.

Referring to FIGS. 4-6, contact foot 134 includes an outer side 134*a* opposite a contact side 134*b*. Contact foot 134 is connected to a corresponding pad 124, with side 134*b* being electrically and mechanically bonded thereto with solder 145 (see FIG. 6). In FIG. 6, the thickness of solder 145 is exaggerated for illustrative purposes. Foot 134 includes bus bar openings 138 and a plurality of solder-flow apertures 140. Apertures 140 have been found to desirably promote the flow of solder 145 to improve the foot/pad connection. Soldering is performed using standard equipment. Openings 138 include a beveled portion 142 and define a portion of a passage 144. The bevel is positioned and shaped to provide a greater opening diameter on contact side 134*a* than on the outer contact side 134*b* of contact foot 134. This beveled portion 142 increases the surface area of foot 134 that is available to make electrical contact with the corresponding conductive pad 123 via solder 145, and otherwise provides improved connection characteristics compared to an unbeveled through-hole. Each opening 138 aligns with a respective opening 128 of board 120 and cavity 118 of plate 114 when bus bar 130 and board 120 are assembled with device 110 to collectively define passage 144. The partial assembly of FIG. 3 depicts passage 144 before it receives various connection components, as shown in FIG. 6. In FIG. 3, the larger opening size on side 134*b* relative to side 134*a* is illustrated in phantom (dashed lines).

FIG. 6 illustrates connector 148 in sectional view. Connector 148 includes an electrically insulative washer 149 in the form of a grommet 150 and a fastener 160 in the form of a screw 162 that are received in passage 144. In one embodiment, grommet 150 is composed of electrically insulative material, such as polyphenylene sulfide. Grommet 150 defines a distal end portion 152, a proximal portion 154 opposite portion 152, and a passage 156 therethrough. Portion 152 is approximately cylindrical or barrel-shaped. Portion 154 includes a flange 158 that abuts portion 142 of bars 130 when portion 152 is inserted into passage 144. Also, portion 154 defines a circumferential chamfer portion 155 about passage 156. The electrically conductive pad 123 is in contact with an electrically insulative layer 121 that is carried on board 120. Insulative layer 121 extends past pad 123 to passage 144. Correspondingly, pad 123 defines an aperture 123*a* that is approximately the same size as the opening defined through side 134*b* of foot 134. This arrangement provides additional clearance to facilitate reliable connection without undesired electrical shorting, and results in a clearance cavity or space 200 with an approximately annular shape that is bounded by portion 142 of foot 134 and portion 152 of grommet 150. Furthermore, the electrically insulative layer 121 also at least partially bounds clearance space 200, providing a floor 201 relative thereto. Board 120 preferably includes a layer of metal or another thermally conductive material. Board 120 is in thermal contact with plate 114.

Screw 162 includes a head 164 and a threaded stem 166 extending from head 164. Head 164 is shaped to compliment and be received in grommet 150 through chamfer portion 155. Chamfer portion 155 provides clearance for the insertion of screw 162. Threaded stem 166 extends through passage 156 of grommet 150 and correspondingly through passage 144 to engage threading in cavity 118. As screw 162 is turned to tighten it into cavity 118, head 164 bears against grommet 150 with a desired degree of force. In turn, grommet 150 bears against bar 130 and board 120—establishing a desired mechanical and thermal coupling to plate 114.

Many different embodiments of the present application are envisioned. For example, in other embodiments, the electronic assembly technique may be applied in a different type of device other than an electric power generation system. In another example, a threaded stem is fixed to device 110 at site 112 that extends through passage 144 and is engaged by a nut to secure board 120 and bars 130. For this alternative, separate cavities 118 need not be present. In yet another arrangement, the electronic assembly does not include a cold plate, but rather a heatsink or substrate of another type. In still other embodiments, different fasteners are contemplated that would occur to one having ordinary skill in the art.

In a further example, the apparatus of the present application includes a heat dissipating device, a printed wiring board with electronic circuitry, an electrical bus bar, an electrically insulative grommet, and a fastener. The heat dissipating device defines a fastening site. The printed wiring board has electronic circuitry and defines a bus with an interconnection pad and a board opening through at least a portion of the pad. The board opening is aligned with the fastening site. The electrical bus bar is connected to the interconnection pad and defines a bus bar opening that is aligned with the board opening. The board opening and the bar opening define at least a portion of a passage to the fastening site. The electrically insulative grommet defines a distal end portion opposite a proximal end portion. The proximal end portion is shaped with a flange. The distal end portion is inserted into the passage with the flange of the proximal end portion abutting the bus bar. The fastener extends through the grommet to provide a mechanical connection of the printed wiring board and the bus bar to the fastening site and maintain thermal contact between the printed wiring board and the heat dissipating device while the grommet electrically insulates the fastener from the bus bar.

In another example, the apparatus includes a heat dissipating device, a printed wiring board with electronic circuitry, an electrical bus bar, an electrically insulative grommet, and a fastener. The heat dissipating device defines a fastening site. The printed wiring board has electronic circuitry and is in contact with the heat dissipating device. The printed wiring board defines a bus with an interconnection pad and a board opening through at least a portion of the pad. The board opening is aligned with the fastening site. The electrical bus bar includes a first electrical contact portion connected to the interconnection pad and a second electrical contact portion. The bus bar is sized and shaped to extend the second contact portion a predetermined distance away from the printed wiring board. The first electrical contact portion defines a bus bar opening aligned with the board opening. The bar opening defines at least a portion of a passage to the fastening site. The electrically insulative grommet defines a distal end portion opposite a proximal end portion. The proximal end portion is shaped with a flange. The distal end portion is inserted into the passage with the flange of the proximal end portion abutting the bus bar about the bar opening. The fastener extends through the grommet to provide a mechanical connection of the printed wiring board and the bus bar to the fastening site and maintain thermal contact between the printed wiring board and the heat dissipating device while the grommet electrically insulates the fastener from the bus bar.

Yet another example comprises an electric power generation system including an inverter assembly. This assembly includes: a cold plate defining a plurality of threaded cavities; a printed wiring board defining a number of interconnection pads and a plurality of board openings through the pads, the board being positioned to align each of the board openings with a corresponding one of the threaded cavities; a number of metallic bus members each including a contact foot, the contact foot defining one or more holes therethrough, the holes each aligning with a respective one of the board openings and the corresponding one of the threaded cavities to collectively define a number of passageways; a number of washers each having a barrel-shaped portion opposite a respective flange portion, the washers each being positioned with the barrel-shaped portion being received in a respective one of the passageways with the respective flange portion abutting the contact foot about a corresponding one of the holes; and a number of fasteners each including a head opposite a stem with threading, the stem of each respective one of the fasteners extending through a respective one of the washers with the threading engaged to the corresponding one of the threaded cavities, the head of each of the fasteners bearing against the respective flange portion to exert a force to mechanically and thermally couple the bus bars and the printed wiring to one another and the cold plate.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow. In reading the claims it is intended that when words such as "a," "an," "at least one," "at least a portion" are used there is no intention to limit the claim to only one item unless specifically stated to the contrary in the claim. Further, when the language "at least a portion" and/or "a portion" is used the item may include a portion and/or the entire item unless specifically stated to the contrary. While the invention has been illustrated and described in detail in the drawings and foregoing description, the same is to be considered as illustrative and not restrictive in character, it being understood that only the selected embodiments have been shown and described and that all changes, modifications and equivalents that come within the spirit of the invention as defined herein or by any of the following claims are desired to be protected.

What is claimed is:

1. An apparatus, comprising:

a heat dissipating device defining a fastening site;

a printed wiring board with electronic circuitry defining a bus with an interconnection pad and a board opening through at least a portion of the pad, the board opening being aligned with the fastening site;

an electrical bus bar connected to the interconnection pad and defining a bus bar passageway that extends from a first side to a second side, the bus bar passageway is aligned with the board opening to define at least a portion of a passage to the fastening site and includes a bevel to provide a larger opening on the second side than the first side, the second side being closer to the interconnection pad than the first side;

an electrically insulative grommet defining a first end portion opposite a second end portion, the second end portion being shaped with a flange, the first end portion being inserted into the passage with the flange abutting the bus bar about the bus bar passageway on the first side, the bevel and the grommet cooperating to define a clearance space therebetween; and a fastener extending through the grommet to provide a mechanical connection of the printed wiring board and the bus bar to the fastening site and maintain thermal contact between the printed wiring board and the heat dissipating device while electrically insulating the fastener from the bus bar with the grommet.

2. The apparatus of claim 1, wherein the bus bar includes a contact foot soldered to the interconnection pad and an elevated connection site extending above the printed wiring board.

3. The apparatus of claim 2, wherein the bus bar has a Z-shaped or S-shaped profile, and the printed wiring board includes an electrically insulating layer extending between the interconnecting pad and the grommet to at least partially bound the clearance space.

4. The apparatus of claim 1, wherein the bus bar is metallic and includes a contact foot soldered to the interconnection pad, the contact foot defining a number of apertures to permit passage of solder therethrough.

5. The apparatus of claim 1, wherein the printed wiring board and the bus bar define another passage with another grommet and another fastener to fasten the printed wiring board and the bus bar to another fastening site of the heat dissipating device.

6. The apparatus of claim 1, wherein the heat dissipating device includes means for flowing a cooling fluid therethrough.

7. The apparatus of claim 1, wherein the fastening site defines a threaded cavity and the fastener is a screw with a threaded stem opposite a head, the head engages the flange, and the stem is at least partially threaded into the threaded cavity.

8. The apparatus of claim 7, wherein:

the bus bar includes a contact foot soldered to the interconnection pad and an elevated connection site extending above the printed wiring board, the contact foot defining a number of apertures therethrough to facilitate solder flow; and the heat dissipating device includes a plate with a passage to flow a cooling fluid therethrough.

9. An apparatus, comprising:

a heat dissipating device defining a fastening site;

a printed wiring board with electronic circuitry defining a bus with an interconnection pad and a board opening through at least a portion of the pad, the board opening being aligned with the fastening site;

an electrical bus bar including a first electrical contact portion connected to the interconnection pad and a second electrical contact portion, the bus bar being sized and shaped to extend the second contact portion a predetermined distance away from the printed wiring board, the first electrical contact portion defining a bus bar opening aligned with the board opening, the bar opening defining at least a portion of a passage to the fastening site and being shaped to provide a clearance space between the bus bar and the printed wiring board;

an electrically insulative grommet defining a distal end portion opposite a proximal end portion, the proximal end portion being shaped with a flange, the distal end portion being inserted into the passage with the flange of the proximal end portion abutting the bus bar about the bar opening; and a fastener extending through the grommet to provide a mechanical connection of the printed wiring board and the bus bar to the fastening site and maintain thermal coupling between the printed wiring board and the heat dissipating device while electrically insulating the fastener from the bus bar with the grommet.

10. The apparatus of claim 9, wherein the bus bar has a Z-shaped or S-shaped profile and first contact portion and the second contact portion each extend along different planes that are generally parallel.

11. The apparatus of claim 9, further comprising means for fixing the bus bar to the interconnection pad.

12. The apparatus of claim 9, wherein the printed wiring board and the bus bar define another passage with another grommet and another fastener to fasten the printed wiring board and the bus bar to another fastening site of the heat dissipating device.

13. The apparatus of claim 9, wherein the heat dissipating device includes a plate with a passage to flow a cooling fluid therethrough.

14. The apparatus of claim 9, wherein the fastening site defines a threaded cavity and the fastener is a screw with a threaded stem opposite a head, the head engages the flange, and the stem is at least partially threaded into the threaded cavity.

15. The apparatus of claim 9, wherein a number of different bus bars are soldered to the printed wiring board.

16. The apparatus of claim 9, wherein the bus bar opening is beveled to present a larger dimension of the opening on a first side of the bus bar that a second side of the bus bar opposite the first side and at least partially defines the clearance space, the first side being placed closer to the interconnection pad than the second side.

17. The apparatus of claim 9, further comprising an electric power generation system including the heat dissipating device and the printed wiring board with electronic circuitry connected thereto with the grommet and the fastener.

18. An apparatus, comprising: an electric power generation system including an inverter assembly, the inverter assembly including:

a cold plate defining a plurality of threaded cavities;

a printed wiring board defining a number of interconnection pads and a plurality of board openings through the pads, the board being positioned to align each of the board openings with a corresponding one of the threaded cavities;

a number of metallic bus members each including a contact foot, the contact foot defining one or more holes therethrough, the holes each aligning with a respective one of the board openings and the corresponding one of the threaded cavities to collectively define a number of passageways, the holes each being shaped with a larger opening on a bottom side than a top side to define a corresponding one of a number of clearance spaces;

a number of washers each having a barrel-shaped portion opposite a respective flange portion, the washers each being positioned with the barrel-shaped portion being received in a respective one of the passageways with the respective flange portion abutting the contact foot about a corresponding one of the holes; and a number of fasteners each including a head opposite a stem with threading, the stem of each respective one of the fasteners extending through a respective one of the washers with the threading engaged to the corresponding one of the threaded cavities, the head of each of the fasteners bearing against the respective flange portion to exert a force to mechanically and thermally couple the bus bars and the printed wiring to one another and the cold plate.

* * * * *